(12) United States Patent
Wong et al.

(10) Patent No.: US 7,223,700 B2
(45) Date of Patent: May 29, 2007

(54) METHOD FOR FABRICATING FINE FEATURES BY JET-PRINTING AND SURFACE TREATMENT

(75) Inventors: William S. Wong, San Carlos, CA (US); Steven E. Ready, Santa Cruz, CA (US); Stephen D. White, Santa Clara, CA (US); Alberto Salleo, San Francisco, CA (US); Michael L. Chabinyc, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 11/251,525

(22) Filed: Oct. 14, 2005

(65) Prior Publication Data
US 2006/0057851 A1    Mar. 16, 2006

Related U.S. Application Data

(62) Division of application No. 10/186,092, filed on Jun. 27, 2002, now Pat. No. 6,972,261.

(51) Int. Cl.
*H01L 21/302* (2006.01)

(52) U.S. Cl. .................. 438/706; 438/725; 438/758; 438/761

(58) Field of Classification Search ............... 438/706, 438/710, 719, 723, 724, 725, 758, 761, 763
See application file for complete search history.

(56) References Cited

U.S. PATENT DOCUMENTS 4,767,489 A    8/1988   Lindner 4,943,818 A    7/1990   Hotomi (Continued)

FOREIGN PATENT DOCUMENTS

EP    0568841 A1    11/1993

(Continued)

OTHER PUBLICATIONS

Sirringaus et al. "High-Resolution Inkjet Printing of All-Polymer Transistor Circuits", Dec. 15, 2000, Science, vol. 290, pp. 2123-2126.*

(Continued)

*Primary Examiner*—Kin-Chan Chen
(74) *Attorney, Agent, or Firm*—Kent Chen

(57) ABSTRACT

A method and system for masking a surface to be etched is described. The method includes the operation of heating a phase-change masking material and using a droplet source to eject droplets of a masking material for deposit on a thin-film or other substrate surface to be etched. The temperature of the thin-film or substrate surface is controlled such that the droplets rapidly freeze after upon contact with the thin-film or substrate surface. The thin-film or substrate is then treated to alter the surface characteristics, typically by depositing a self assembled monolayer on the surface. After deposition, the masking material is removed. A material of interest is then deposited over the substrate such that the material adheres only to regions not originally covered by the mask such that the mask acts as a negative resist. Using such techniques, feature sizes of devices smaller than the smallest droplet printed may be fabricated.

22 Claims, 9 Drawing Sheets

U.S. PATENT DOCUMENTS

| | | | |
|---|---|---|---|
| 5,591,490 A | | 1/1997 | Quate |
| 5,695,658 A | * | 12/1997 | Alwan .......................... 216/42 |
| 5,700,316 A | | 12/1997 | Pontes et al. |
| 5,843,847 A | * | 12/1998 | Pu et al. ...................... 438/723 |
| 5,852,975 A | | 12/1998 | Miyabe et al. |
| 5,882,538 A | * | 3/1999 | Martin et al. ................. 216/71 |
| 5,898,446 A | | 4/1999 | Moriyama |
| 6,196,672 B1 | | 3/2001 | Ito et al. |
| 6,337,222 B1 | * | 1/2002 | Shimoda et al. .............. 438/29 |
| 6,386,671 B1 | | 5/2002 | Huston et al. |
| 6,436,229 B2 | * | 8/2002 | Tai et al. ............. 257/E21.218 |
| 6,503,831 B2 | * | 1/2003 | Speakman ................... 438/674 |
| 6,808,972 B2 | * | 10/2004 | Sirringhaus et al. ........ 438/200 |
| 6,872,320 B2 | * | 3/2005 | Wong et al. ................... 216/13 |
| 2002/0154187 A1 | | 10/2002 | Wong et al. |
| 2004/0029382 A1 | * | 2/2004 | Kawase ...................... 438/689 |
| 2004/0266207 A1 | * | 12/2004 | Sirringhauss et al. ....... 438/725 |

FOREIGN PATENT DOCUMENTS

| | | |
|---|---|---|
| EP | 0 952 513 A1 | 10/1999 |
| JP | 55138841 | 10/1980 |

OTHER PUBLICATIONS

H. Gleskova, E.Y. MA, S. Wagner, D.S. Shen, a-Si:H TFT fabricated by electrophotographic printing, Digest of Technical Papers, First Edition, Proceedings of 3rd Annual Display Manufacturing Technology Conference, San Jose CA, Feb. 6-8, 1996. p. 97-98.

H. Gleskova, S. Wagner, D.S. Shen Photoresist-free fabrication process for a-Si:H thin film transistors, Journal of Non-Crystalline Solids 227-230 (1998) 1217-1220.

J. Z. Wang, Z. H. Zheng, H.W. Li, W.T.S. Huck and H. Sirringhaus Dewetting of conducting polymer inkjet droplets on patterned surfaces, Nature Materials, vol. 3, Mar. 2004 pp. 171-176.

Gokhan Percin, Thomas S. Lundgren, Butrus T. Khuri-Yakub Controlled ink-jet printing and deposition of organic polymers and solid particles, American Institute of Physics, Applied Physics Letters, vol. 73, No. 16, Oct. 1998, pp. 2375-2377.

E. Y. Ma, S. Wagner a-Si:H Thin Film Transistors on Rollable 2-μm Thick Steel Foil, Mat. Res. Soc. Symp. Proc. vol. 507, 1998 Materials Research Society, pp. 13-18.

H. Sirringhaus, T. Kawase, R. H. Friend, T. Shimoda, M. Inbasekaran, W. Wu, E. P. Woo High-Resolution Inkjet Printing of All-Polymer Transistor Circuits, Science Magazine, vol. 290, Dec. 15, 2000, pp. 2123-2126.

Zhenan Bao, Yi Feng, Ananth Dodabalapur, V. R. Raju, Andrew J. Lovinger High Performance Plastic Transistors Fabricated by Printing Techniques, American Chemical Society, Chem. Mater. 1997, 9, pp. 1299-1301.

Shun-Chi Chang, Jayesh Bharathan, Yang Yang, Roger Helgeson, Fred Wudl, Michael B. Ramey, John R. Reynolds Dual-color polymer light-emitting pixels processed by hybrid inkjet printing, American institute of Physics, Applied Physics Letters, vol. 73, No. 18, Nov. 1998, pp. 2561-2563.

H. Gleskova, S. Wagner, D. S. Shen Electrophotographic Patterning of Thin-Film Silicon on Glass Foil, IEEE Electron Device Letters, vol. 16, No. 10, Oct. 1995, pp. 418-420.

H. Gleskova, R. Konenkamp, S. Wagner, D. S. Shen Electrophotographically Patterned Thin-Film Silicon Transistors, IEEE Electron Device Letters, vol. 17, No. 6, Jun. 1996, pp. 264-266.

Masakazu Sanada, Kayoko Nakano, Minobu Matsunaga Characteristics of material for Photoresist Spin Coating: Property for Reduction of photoresist Consumption, 1998 Publication Board, Japanese Journal of Applied Physics, vol. 37, pp. L144-L1451.

Hayes, Donald J., Wallace, David B., and Cox, W. Royall, MicroFab Technologies, Inc., "MicroJet Printing of Solder and Polymers for Multi-Chip Modules and Chip-Scale Packages", IMAPS '99, pp. 1-6.

Hayes, Donald J., Cox, W. Royall and Grove, Michael E., MicroFab Technologies, Inc., "Low-Cost Display Assembly and Interconnect Using Ink-Jet Printing Technology", Display Works '99, pp. 1-4.

Szczech, J.B. Megaridis, C.M., Gamota, D.R., Zhang, J., M.E. Department, University of Illinois at Chicago, Il.; Motorola Inc., Schaumburg, Il.; "Fine-Line Conductor Manufacturing Using Advanced Drop-on-Demand PZT Printing Technology", Jun. 27, 2000, pp. 1-32.

Wallace, David B. and Hayes, Donald J., MicroFab Technologies, Inc., "Solder Jet Technology Update", Proceedings ISHM 97, pp. 1-4.

"Solder Jet Technology Development, NIST/ATP Project No. 93-01-0183", Pacific NW Pollution Prevention Resource Center Pollution Prevention Research Projects Database, Sep. 1999.

Madou, M. Fundamentals of Microfabrication, Boca Raton, Florida, CRC Press LLC 1997, p. 3-4 TK7836.M33.

* cited by examiner

METHOD FOR FABRICATING FINE FEATURES BY JET-PRINTING AND SURFACE TREATMENT

CROSS-REFERENCE TO RELATED APPLICATIONS

This is a divisional of U.S. application Ser. No. 10/186,092, filed Jun. 27, 2002, now U.S. No. 6,972,261 by the same inventors and claims priority therefrom. This divisional application is being filed in response to a restriction requirement in that prior application and contains rewritten and/or additional claims to the restricted subject matter.

BACKGROUND

In recent years, the increasingly widespread use of display device alternatives to the cathode ray tube (CRT) has driven the demand for large-area electronic arrays. In particular, amorphous silicon and laser-recrystallized poly-silicon liquid crystal displays are commonly used in lap-top computers. However, fabricating such large-area arrays is expensive. A large part of the fabrication cost of the large-area arrays arises from the photolithographic process used to pattern the array. In order to avoid such photolithographic processes, direct marking techniques have been considered as an alternative to photolithography.

Examples of direct marking techniques used in place of photolithography include utilizing a xerographic process to deposit a toner that acts as an etch mask and using an ink-jet printhead to deposit a liquid mask. Both techniques have corresponding problems. Toner-based materials are hard to control and difficult to remove after deposition.

The use of ink-jetted liquids to directly write etch masks is a practical alternative to printed toner although jet printing also possesses inherent complexities. Controlling the feature sizes of printed liquid masks is difficult due to spreading of the liquid on the surface after deposition. For example, when liquid drops are deposited onto a surface, the droplet configuration is largely determined by its wetting properties. Typically, small wetting or contact angles (the angle formed by the edge of a droplet and the substrate surface) are required to obtain good adhesion to a surface but this condition allows the liquid to spread and form relatively large features. On the other hand, if the liquid does not wet the surface due to a high surface energy, a large contact angle will form allowing for the formation of small drop features. However these printed droplets may adhere poorly. Neither situation is desirable in semiconductor processing—the small contact angle droplets increase feature size while large contact angle droplets give unreliable patterning.

Special piezoelectric ink-jet printheads allow generation of low droplet volumes. Small printed features have been obtained using ink-jet printheads as described in W. S. Wong, et al., "Amorphous silicon thin-film transistors and arrays fabricated by jet printing" in Appl. Phys. Lett., 80, 610 (2002). In the described reference, wax etch masks patterned by ink-jet printing are used to produce feature sizes on the order of 20-40 µm with layer registration to within a few micrometers. However, even with these printheads, the small sizes of features critical to the fabrication of large-area microelectronic arrays have been difficult to achieve. In using a jet-printed feature as an etch mask, the minimum feature size was limited by the smallest droplet, typically in the range of 20 µm.

Thus a method of forming smaller features using inexpensive printing techniques is needed.

SUMMARY

The present invention relates generally to the field of device processing. In particular the invention relates to a method and apparatus for fabricating small features devices using materials from aqueous or non-aqueous organic solutions.

In the invention, a print procedure marks or prints a protective layer in a pattern on regions of a substrate that will define exposed and covered areas on the surface. Exposed substrate areas are treated to cause feature formation on the exposed regions. In one embodiment of the invention, the substrate treatment alters the surface characteristics of the exposed regions. The patterned layer is then removed and the substrate is coated such that a material of interest adheres only to the regions with the altered surface characteristics.

In a second embodiment, the printed protective pattern layer covers a pretreated surface. Areas of the surface unprotected by the protective pattern layer is then re-treated to remove or modify the pretreated surface. The protective pattern layer is subsequently removed and a new layer deposited to form desirable features. The new layer adheres only to the areas of the surface that were originally unprotected by the protective pattern layer. The minimum feature size of the patterned region is not critical since the feature of interest is defined by openings in the patterned region or spacing between adjacent patterned regions.

BRIEF DESCRIPTION OF THE DRAWINGS

A more complete appreciation of the invention may be more readily understood by referring to the detailed description and the accompanying drawings.

DETAILED DESCRIPTION

In the following detailed description a method and system of forming fine-feature devices on a substrate using printed patterns will be described. The system will create a pattern, typically using a printer to controllably eject individual droplets to form a patterned protective layer or coating over regions of the substrate to define the outline of a feature. Regions that were not at one time covered by protective layer will be subject to deposition (or removal) of materials used to form various features. Thus feature size will not be limited by droplet size, but instead by how closely droplets can be positioned together without combining to form a single droplet. A system to tightly control the boundaries of the droplet and minimize possible coalescence of juxtaposed droplets will also be described.

Figure 1:
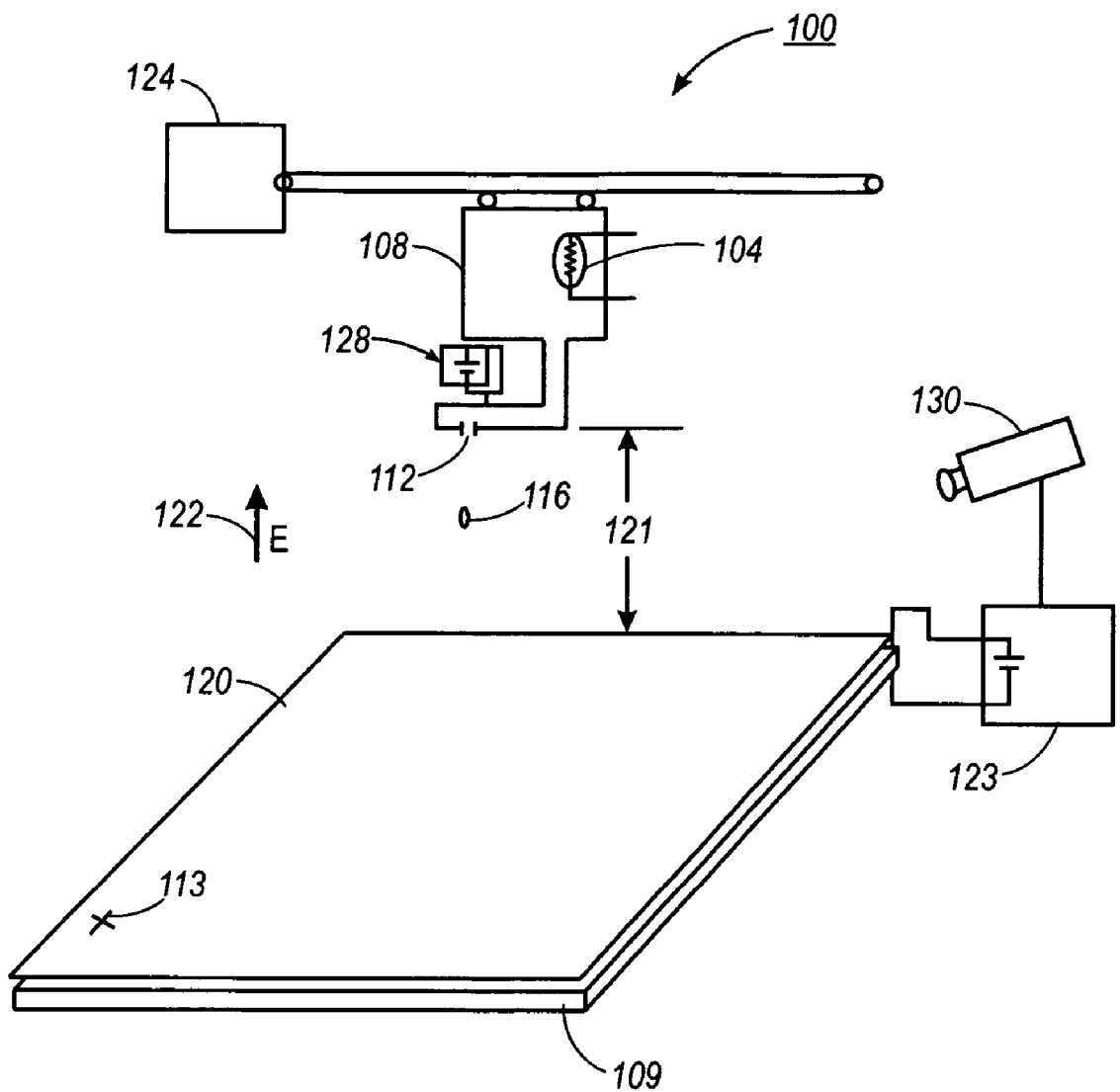
FIG. 1 shows one embodiment of a droplet source system used to eject a phase-change material onto a substrate.

FIG. 1 shows a system 100 including a heat source 104 that heats a reservoir 108 of typically phase-change material to a temperature that is sufficient to maintain the material in a liquid state. In one embodiment of the invention, the temperature of the reservoir is maintained above 100 degree centigrade and in some embodiments, at temperatures above 140 degrees centigrade, a temperature sufficient to liquify most phase change organics.

The phase-change material may be an organic media that melts at low temperatures. Other desirable characteristics of the phase-change material include that the patterning material is non-reactive with organic and inorganic materials used in typical semiconductor materials processing, and that the phase change material has a high selectivity to etchants. An alternate embodiment of the invention may also include a material suspended in a liquid. When liquid suspension is used, the substrate material is maintained above the boiling point of the liquid, and after deposition of the patterning material, the liquid carrier evaporates upon contact with the substrate surface. When evaporation is used, the phase change process is directed from liquid to vapor, rather than from liquid to solid.

An additional desirable characteristic of the phase-change patterning material is that the resulting pattern should be robust enough to withstand wet-chemical or dry etching processes. When a dry etching process is used, phase change patterning materials with low-vapor pressures may be used. Wax is an example of a phase-change material with the previously described characteristics. Kemamide 180-based waxes from Xerox Corporation of Stamford Conn. is one example of a suitable wax for use as a phase-change patterning material.

A plurality of droplet sources such as droplet source 112 receives the liquid phase-change marking material from reservoir 108 and outputs droplets 116 for deposition on a substrate 120. The substrate is typically a thin film of semiconductor material or a thin-film metal such as aluminum. The substrate is maintained at a temperature such that the droplet cools rapidly after deposition. In some embodiments of the invention, a wetting agent, typically a dielectric material such as silicon dioxide, $SiO_2$ or silicon nitride, $Si_3N_4$ may be included on the surface to enhance wetting thereby assuring that sufficient wetting occurs to form a good contact between the pattern and the substrate. The temperature of the system is maintained such that the cooling rate is sufficient to control the behavior of the droplet after contacting substrate 120 despite the enhanced wetting properties of the surface to be etched.

When increased coalescence between adjacent droplets is required, the substrate temperature can be increased to increase droplet spreading and thereby increase coalescence. When printing lines of Kemamide-based wax from an acoustic ink-jet printer, it has been found that increasing the substrate temperature from 30 degrees to 40 degrees centigrade improves the print quality of the pattern. In the case of Kemamide-based waxes, it has been found that excellent results are achieved when the surface is maintained at 40 degrees centigrade, which is about 20 degrees centigrade below the freezing point of the wax. At 40 degrees centigrade, the temperature of the substrate is still low enough that the droplet rapidly "freezes" upon contacting substrate 120.

In order to minimize the possibility of partial midair freezing of droplets in space 121 between droplet source 112 and substrate 120, an electric field 122 may be applied to accelerate the droplet from droplet source 112 to substrate 120. The electric field may be generated by applying a voltage, typically between one to three kilovolts between droplet source 112 and an electrode or platen 122 under substrate 120. The electric field minimizes droplet transit time through space 121 and allows substrate surface temperature to be the primary factor controlling the phase change operation. Moreover, the increased droplet velocity in space 121 improves the directionality of the droplet allowing for improved straight-line features.

After a droplet of marking material is deposited on substrate 120, the relative positions of the substrate and the droplet source are adjusted to reposition the droplet source over a second position to be patterned. The repositioning operation may be achieved either by moving droplet source 112 or by moving substrate 120. In the illustrated embodiment, a control circuit 124 moves droplet source 112 in a predetermined pattern over substrate 120. A driver circuit 128 provides energy to droplet source 112 causing ejection of droplets when droplet source 112 is positioned over a region of substrate 120 to be patterned. By coordinating the movement of droplet source 112 with the timing of droplet source outputs, a pattern can be "printed" on the substrate.

As each drop is printed, a feedback system may be used to assure droplets of proper size. An imaging system, such as camera 122, may be used to monitor droplet size. When smaller features are to be printed, or the droplet size otherwise reduced, a temperature control circuit 123 lowers the temperature of a surface of substrate 120. The lower temperature increases the quench rate resulting in rapid solidification of the phase change patterning material upon contact with substrate 120. When larger droplets are needed, usually for merging droplets in larger features, temperature control circuit 123 raises the temperature of substrate 120. In one embodiment of the invention, temperature control circuit 123 includes a heating element thermally coupled to substrate 120 such that ambient heating of media around the substrate is minimized.

In one embodiment of the invention, the phase change material is a solid at temperatures below approximately 60 degrees centigrade. In such embodiments, it may be unnecessary to cool the substrate below room temperature because as previously described, a sufficiently small droplet cools rapidly when a 20 degree temperature differential is maintained between the freezing point of the phase change material and the substrate temperature. In such cases, the temperature control circuit may merely be a sensor and a heater that raises the substrate slightly above room temperature when larger feature sizes are to be printed.

In order to control and align the movement of droplet source 112, printed alignment marks, such as mark 113, patterned from a previous patterned layer may be used to coordinate the next overlying layer. An image processing system such as the previously described camera may be used to capture the orientation of the previous patterned layer. A processing system then adjusts the position of the overlying pattern layer by altering the pattern image file before actual printing of the pattern layer. In this way, the substrate remains fixed and mechanical movement of the substrate holder is unnecessary. Instead positioning adjustment are accomplished in software and translated to movements of droplet source 112.

Figure 2:
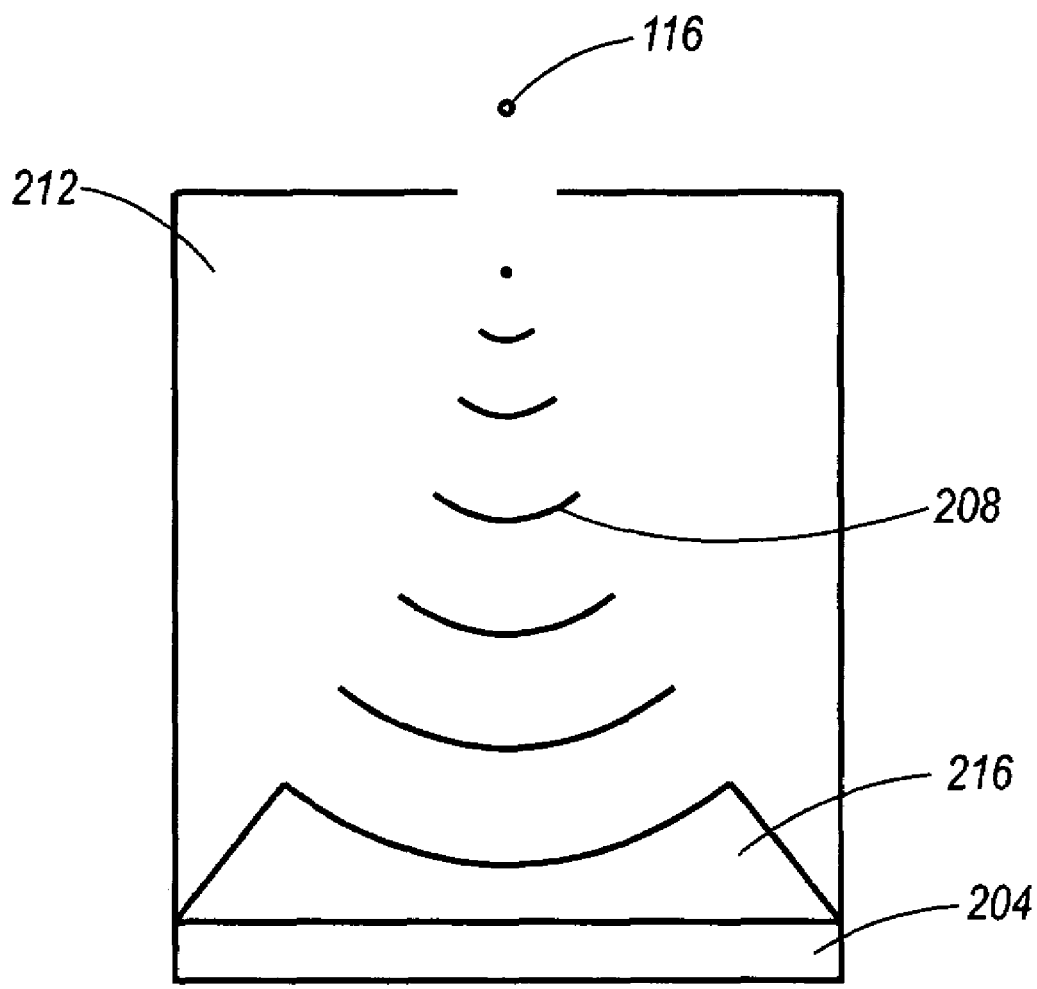
FIG. 2 shows a source of acoustic waves that may be used to eject droplets in the droplet source system of FIG. 1.

Each droplet source may be implemented using a variety of technologies including traditional ink-jet technology. An alternative technology well suited for generating extremely small droplet sizes is the use of sound waves to cause ejection of droplets of patterning material as done in acoustic ink printing systems. FIG. 2 shows one embodiment of an acoustic droplet source 200 implemented using acoustic ink printing technology.

In FIG. 2, a source of acoustic waves such as piezo electric driver 204 generates acoustic waves 208 in a pool 212 of phase change patterning material. Acoustic lens 216 focuses the acoustic waves such that a droplet of phase change patterning material is ejected from the surface of pool 212. The droplet is deposited on substrate 120 of FIG. 1.

Figure 3:
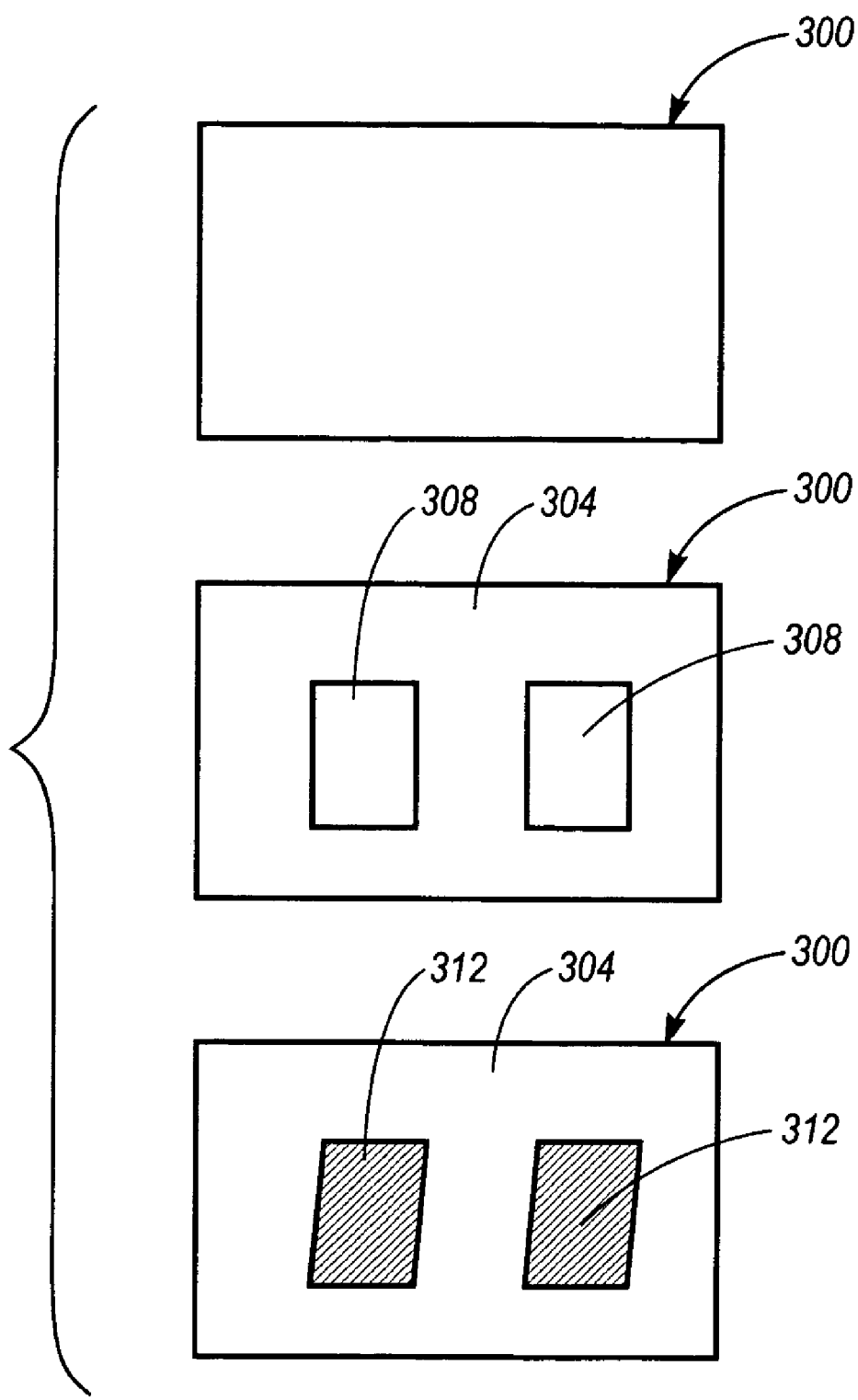
FIG. 3 shows a top view of a substrate at various stages in a process to form fine features.
Figure 4:
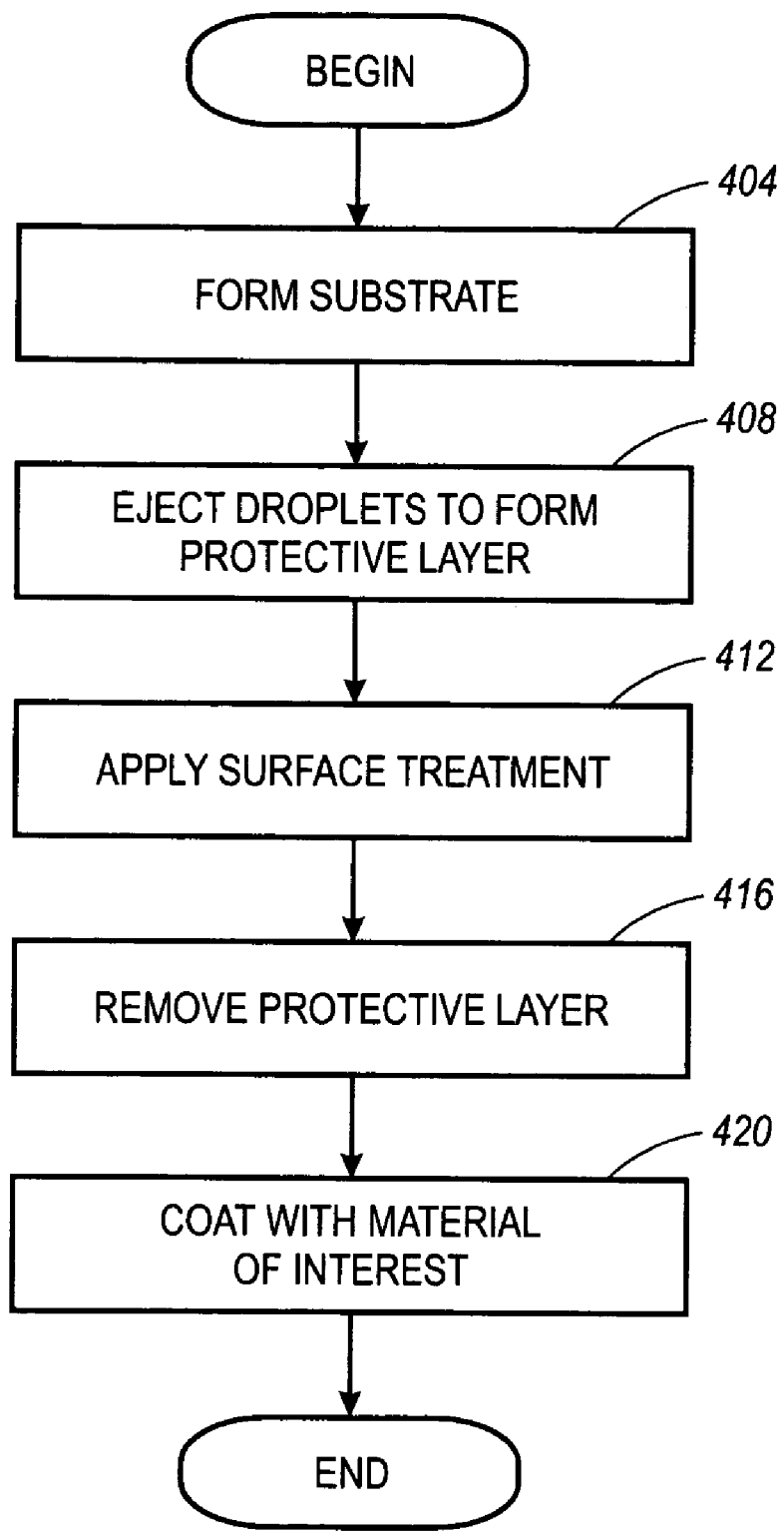
FIG. 4 is a flow chart that describes the operations used to fabricate fine features.

FIG. 3 shows a top view of a substrate at various stages in a process to form fine features and FIG. 4 is a flow, chart that describes the operations used to fabricate the fine features. As used herein, fine features are defined as features that have either a width or length typically less than 50 micrometers. Initially a substrate 300 is provided as described in block 404. Examples of typical substrate surfaces include a thin film surface such as an epitaxial layer supported by glass or a polymer such as poly(ethyleneterephthalate). When thin film transistors are being formed, common substrate materials include gold or silicon oxide. Typically, the substrate is easily wettable by polar liquids such that the contact angle of the liquids on the substrate form small contact angles, typically less than 90 degrees. Hydrophilic wettable surface allows liquid droplets to be quickly absorbed into the substrate.

A printing apparatus such as the printing apparatus of FIG. 1 ejects droplets of a protective material in a pattern over the substrate in block 408 resulting in a patterned protective layer 304 over substrate 300. The protective material may be made of a variety of materials, typically materials that solidify reasonably soon after contact to minimize absorption into the substrate. The protective material may be deposited using a variety of techniques. One method of deposition is described in filed patent application Ser. No. 09/838,685 entitled "APPARATUS FOR PRINTING ETCH MASKS USING PHASE-CHANGE MATERIALS" and Ser. No. 09/838,684 entitled "METHOD FOR PRINTING ETCH MASKS USING PHASE-CHANGE MATERIALS" which are hereby incorporated by reference. The rapidly solidifying protective material may be made from a number of different compounds. One example of a suitable protective material is the previously described wax compound such as Kemamide 180-based wax from Xerox Corporation of Stamford Conn.

The deposited pattern includes openings 308 in the protective layer that define features to be fabricated. The minimum dimensions of the openings in the protective layer 304 defines the resolution of the features to be fabricated.

After deposition of the pattern, a surface treatment is applied to the exposed portions of the substrate (portions of the substrate not covered by the pattern), including the openings, as described in block 412 of FIG. 4. In one embodiment of the surface treatment, the exposed regions of the substrate are exposed to a binder, a surfactant or other chemical treatment to differentiate the exposed surface of the substrate from the patterned areas. One method of differentiation is that the chemical treatment changes the wettability of the substrate, thus when a positive protective pattern was formed, if the substrate was originally hydrophilic, exposed regions will be hydrophobic. In alternate embodiments, an originally hydrophobic substrate may be converted to a hydrophilic substrate in the exposed regions.

After surface treatment, the protective layer pattern may be removed as described in block 416. Removal of the pattern may be done by a variety of techniques including using organic solvents such as tetrahydrofuran (THF). After removal of the pattern, the substrate is coated with a material of interest that preferentially adheres to formerly patterned or unpatterned areas depending on the surface treatment as described in block 420. A negative of the printed pattern is formed when the material of interest preferentially adheres to previously unpatterned areas. A positive of the printed pattern is formed when the material of interest adheres to the previously patterned areas. Negative patterns allow the formation of small features, for example, a fine line feature, having a feature size smaller than the minimum spot size of an ink jetted wax droplet can be created between adjacent lines in a printed pattern.

In an alternate embodiment of the invention, the surface treatment may involve directly depositing a material of interest over the patterned substrate. For example, a thin-film layer 312 may be formed to adhere to unpatterned or exposed portions of the substrate. Such a thin-film layer may be deposited using printing techniques, conventional deposition or coating processes. When a solution of a material in a polar solvent is used, the protective pattern acts as a nonwetting surface to prevent coverage of protected regions, allowing coverage only of the wettable substrate exposed in the openings of the protective layer. One example of a conductive polymer in an aqueous mixture is Baytron P manufactured by Bayer Corporation (Pittsburgh, Pa.) which may be coated onto the surface using a spin-on application. Alternative methods of exposure to a polar solution may include either through printing or by dipping in a bath solution. After application of the thin film, the protective pattern may be removed leaving the thin film covering only areas that were formerly openings in the protective layer.

The above operations may be repeated in various combinations to eventually form a multilayered semiconductor structure. The materials used to form a thin-film layer 312 are not necessarily dissolved in an aqueous solution. In certain instances, the hydrophobicity of the patterning material prevents sufficient wetting of the exposed regions. In such cases, solvents may be used to assist in wetting the exposed regions or alternatively, surfactants may be added to aqueous solutions to improve the wetting characteristics. In an alternate embodiment, both the patterned and exposed areas may be coated simultaneously followed by a lift-off process that removes the wax and defines the exposed regions.

Figure 5:
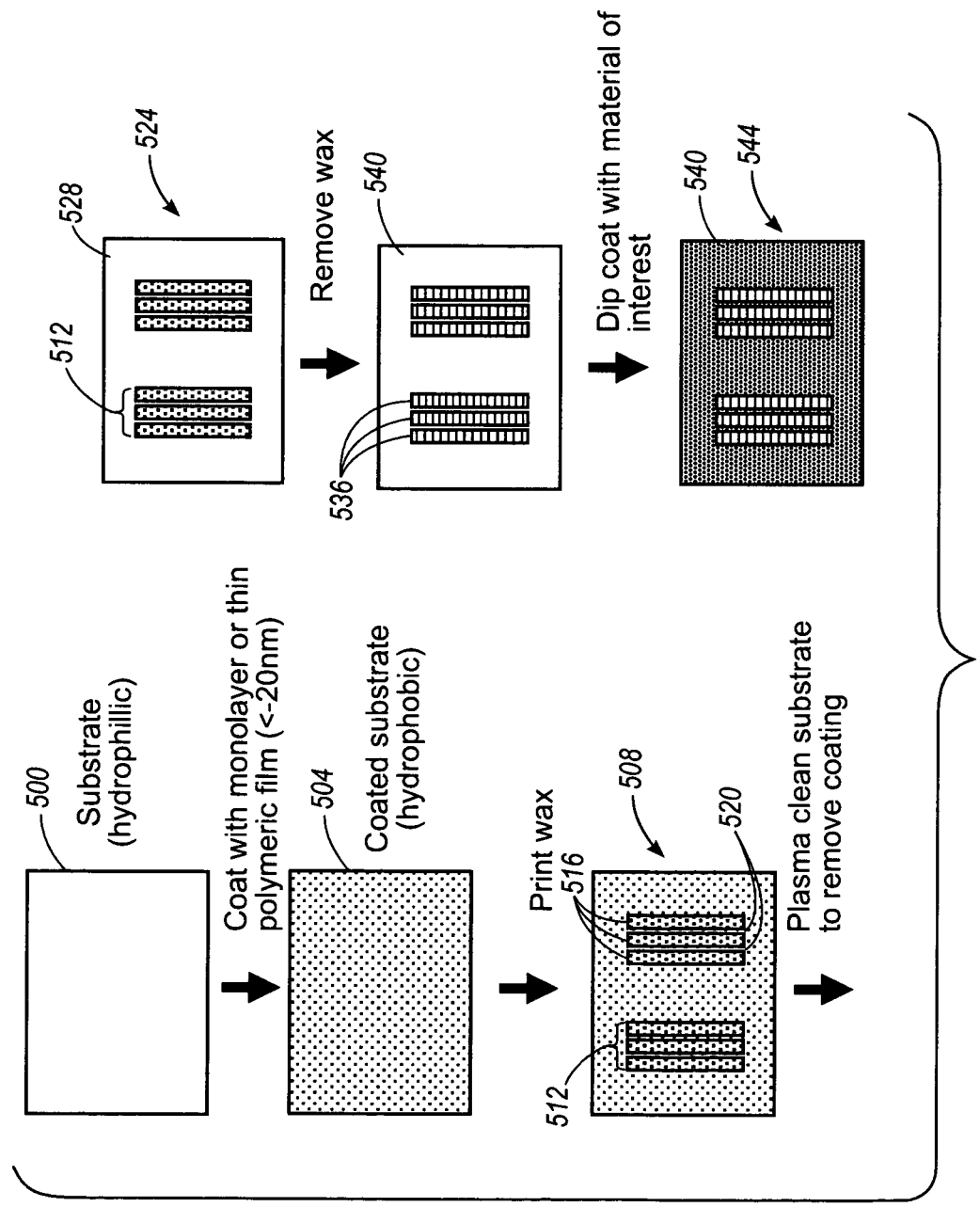
FIG. 5 shows a top view of a substrate undergoing print-dip patterning to form fine features.

FIG. 5 shows a series of top views of a substrate undergoing print-dip patterning to form fine features. The print-dip patterning shown in FIG. 5 is a specific example of the general methods shown in FIGS. 3 and 4 and described in the accompanying text. In particular, the method described in FIG. 5 shows one method of achieving a hydrophobic substrate through a thin film coating and a plasma cleaning surface treatment to achieve a hydrophilic unpatterned region and a hydrophobic patterned region.

In the first structure 500 of FIG. 5, a hydrophilic substrate is coated with a thin film such as a thin polymeric film or a monolayer. An example of a typical coating material is octadecyltricholorosilane, otherwise known as OTS. Another example of a coating layer is organic trichlorosilane. Other organic compounds, typically tricyclines, may also be used as a coating layer. In order to maintain uniformity across the coating surface and minimize processing time, the layer is typically kept thin, less than 10 nanometers thick. Thicker coating can also be used if deposition time is not a factor in the overall fabrication process. The coated substrate presents a hydrophobic surface as shown in the image of the coated substrate 504.

A protective pattern 512 is printed over the coated substrate to result in printed patterned surface 508. The pattern is typically a wax mask, such as Kemimide-based wax. Although a typical width of each printed line 516 may be 50 micrometers, the spacing 520 between adjacent lines may be controlled down to 5 micrometers. In one implementation, a Tektronix Piezoelectric printhead with an x-y translation stage having a resolution of 100 nm was used to deposit the pattern.

The hydrophobic coating is removed in regions unprotected by the protective pattern resulting in structure 524. A process such as plasma treatment or a chemical oxidant may be used to remove the hydrophobic coating. Removal of the hydrophobic coating exposes the underlying hydrophillic substrate in regions 528 unprotected by pattern 512. Subsequently, pattern 512 itself is removed. Removal of pattern 512 results in structure 532 where the formerly patterned regions 536 are hydrophobic and the unpatterned regions 540 are hydrophillic.

Finally, a material of interest may be deposited over structure 532 such that the material of interest adheres only to the unpatterned regions 540 yielding the structure 544. Such a deposition may occur by dip coating structure 532 in a solution containing the material of interest, such as a polymeric organic or colloidal inorganic semiconductors and polymeric organic or colloidal inorganic conductors.

The described methods allows for overlays of subsequent layers to form devices having features sizes less than 5 micrometers using printed patterns. The spacing between printed dots, rather than the printed dots themselves define the feature size making possible the formation of relatively small features even using larger dot sizes. However, the use of larger dots does not alleviate the need for tight control over print dot boundaries. One method of tightly controlling print dot boundaries is to print using a phase change material and carefully controlling the temperature of the substrate upon which the phase change material is deposited. The temperature is maintained such that as the droplet source deposits droplets of phase-change patterning material onto the surface of the substrate, the droplets remain in a liquid state for only a very brief period of time. As previously described, this can be achieved by maintaining the temperature of the substrate below the freezing point of the phase change patterning material.

Figure 6:
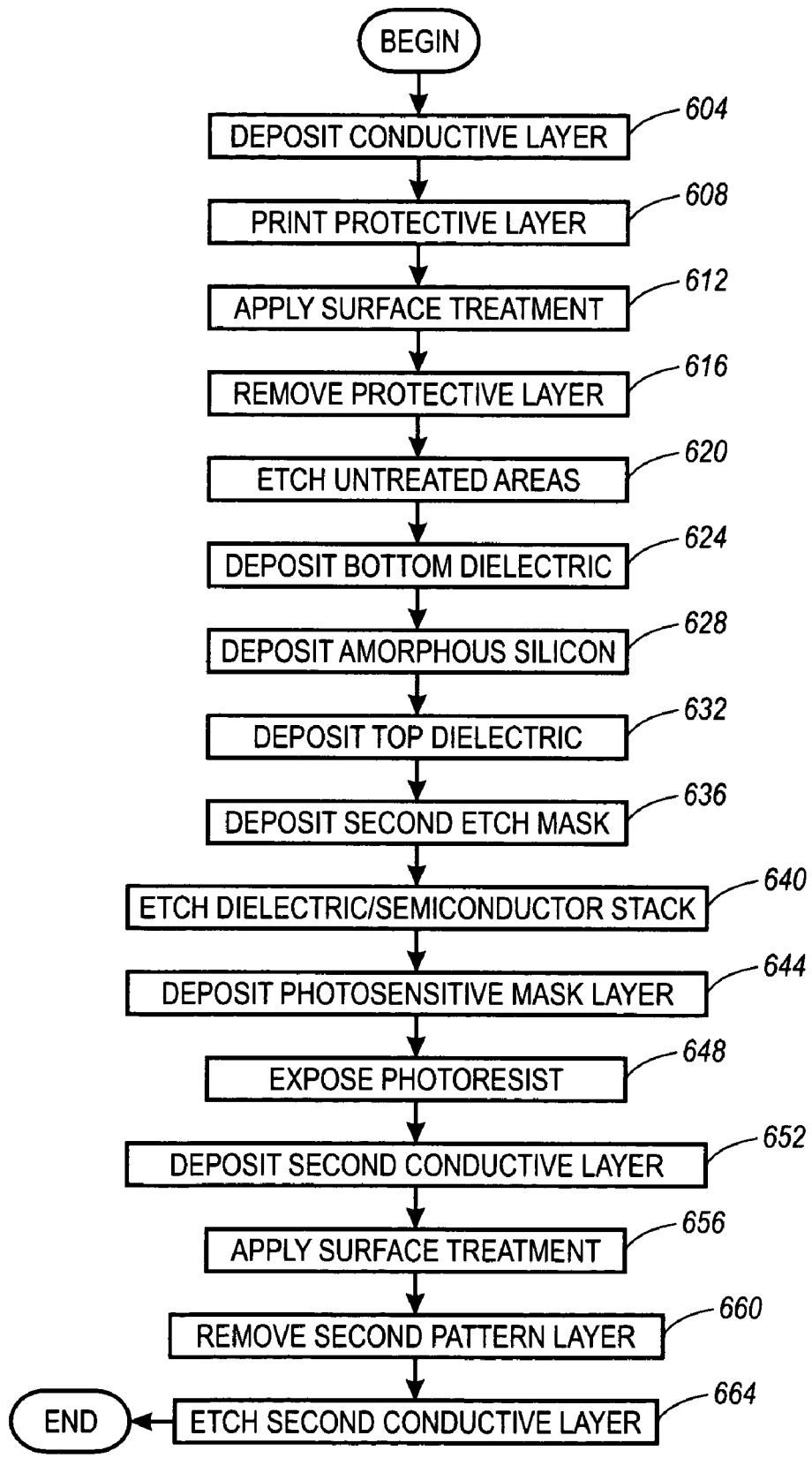
FIG. 6 is a flowchart that describes one method of forming an amorphous semiconductor thin-film transistor using one embodiment of the invention.
Figure 7:
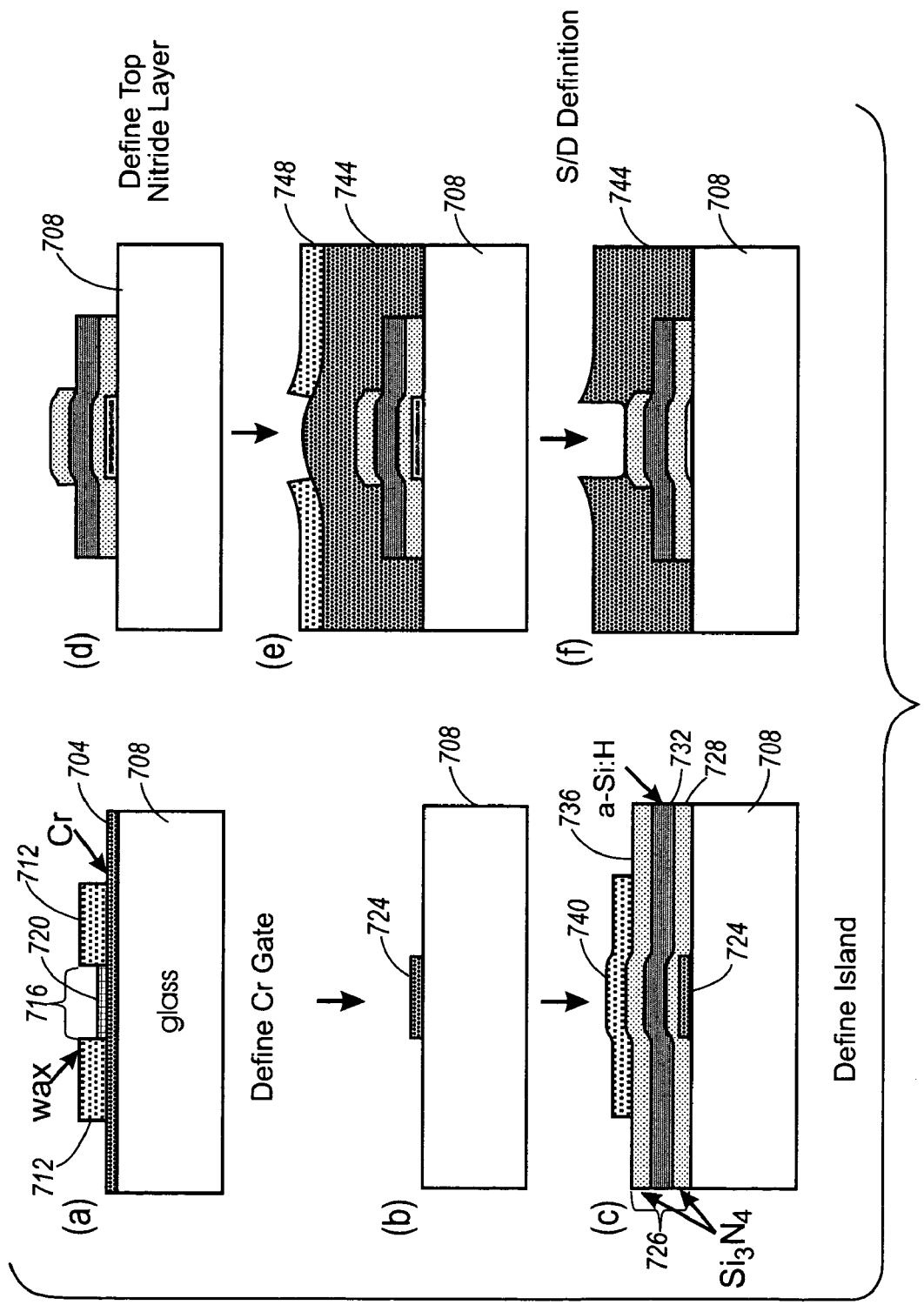
FIG. 7 shows a side view of the formation of an amorphous semiconductor thin-film transistor at various stages of fabrication.

One application of the described patterning and surface treatment procedure is to form fine features for fabricating an amorphous silicon thin-film transistor (TFT). FIG. 6 is a flow chart showing typical operations to form an example TFT while FIG. 7 shows cross sectional views of the TFT at various stages in the fabrication process. In block 604, a conductive layer 704 such as silver, gold or palladium that subsequently forms the bottom gate electrode of the TFT is deposited onto a transparent substrate 708 such as glass or quartz.

In block 608, a first patterned protective layer is printed over the conductive layer. The protective layer is typically a wax 712 that is deposited using an ink jet printing process. The spacing 716 between adjacent masked regions defines a fine feature to be fabricated In block 612, a surface treatment is applied to the TFT structure. Typical surface treatments include exposure of the surface to OTS or a self-assembled monolayer. The self-assembled monolayer 720 forms a mask layer for the gate electrode. Although palladium and gold are typically associated with monolayer formation, more conventional gate electrode metals such as chromium may also be used with a compatible self-assembled monolayer.

In block 616, the printed protective layer is removed leaving the surface treatment, typically a self assembled monolayer, as the masking element. Regions of transparent substrate unprotected by the surface treatment are etched in block 620 leaving behind only a gate electrode 724 remaining over the substrate 708 as shown in FIG. 7. After formation of the gate electrode, a thin film transistor stack 726 is formed over the gate electrode 724. In block 624, a bottom dielectric layer 728, such as silicon nitride or silicon dioxide, is deposited over the gate electrode. An amorphous silicon layer 732 is deposited over bottom dielectric layer 728 in block 628. Finally, in block 632, a top dielectric layer 736, such as silicon nitride or silicon dioxide, is deposited over amorphous silicon layer 732 to complete the thin-film transistor stack. Typical thickness of gate electrode, bottom dielectric, amorphous silicon, and top dielectric layers are 100 nm, 300 nm, 50 nm, and 200 nm, respectively. The described patterning process may be repeated on subsequently deposited layers, composed of bottom dielectric, semiconductor, and top dielectric layer over entire substrate surface to form multiple TFTs.

A second feature etch mask 740 (called the island mask) is deposited over the top dielectric layer in block 636 to form the transistor active-area stack also called the island structure. Dielectric and semiconductor stack are etched in block 640 and the printed pattern is removed to define the island features and device active areas. A photosensitive mask layer, such as positive photoresist 740, is then deposited over the substrate surface in block 644. In block 648, the mask layer is defined by exposing the photoresist 740 to ultraviolet light through the backside of transparent substrate 708. The opaque bottom gate electrode 724 serves as a mask for the ultraviolet light reaching the photoresist. Thus mask features are automatically self-aligned to bottom gate electrodes 724 forming a self-aligned source/drain region over the island area.

A second conductive layer, such as: gold/titanium-tungsten or palladium/titanium-tungsten tri-layers are deposited in block 652 to form a source/drain metal contact 744. The typical thickness of the source/drain contact metal is 100-200 nm; while a typical thickness of the adhesive layer (titanium/tungston) is 5-10 nm. A second pattern layer 748 is printed over second conductive layer 744. In one embodiment of the invention, the pattern layer 748 is printed such that fine features are defined by the openings in pattern layer 748. The second conductive surface is treated with a surface treatment such as OTS or a self-assembled monolayer in block 656. In block 660, the second pattern layer 478 is removed leaving behind the surface treatment that defines the fine features. The second conductive layer is then etched with the surface treatment acting as a mask to create fine features in block 664. Other source/drain contact metals, such as aluminum, chromium, aluminum/titanium-tungsten tri-layers or chromium/titanium-tungsten tri-layers can be used with the appropriate self assembled monolayer to complete the final structure.

Figure 8:
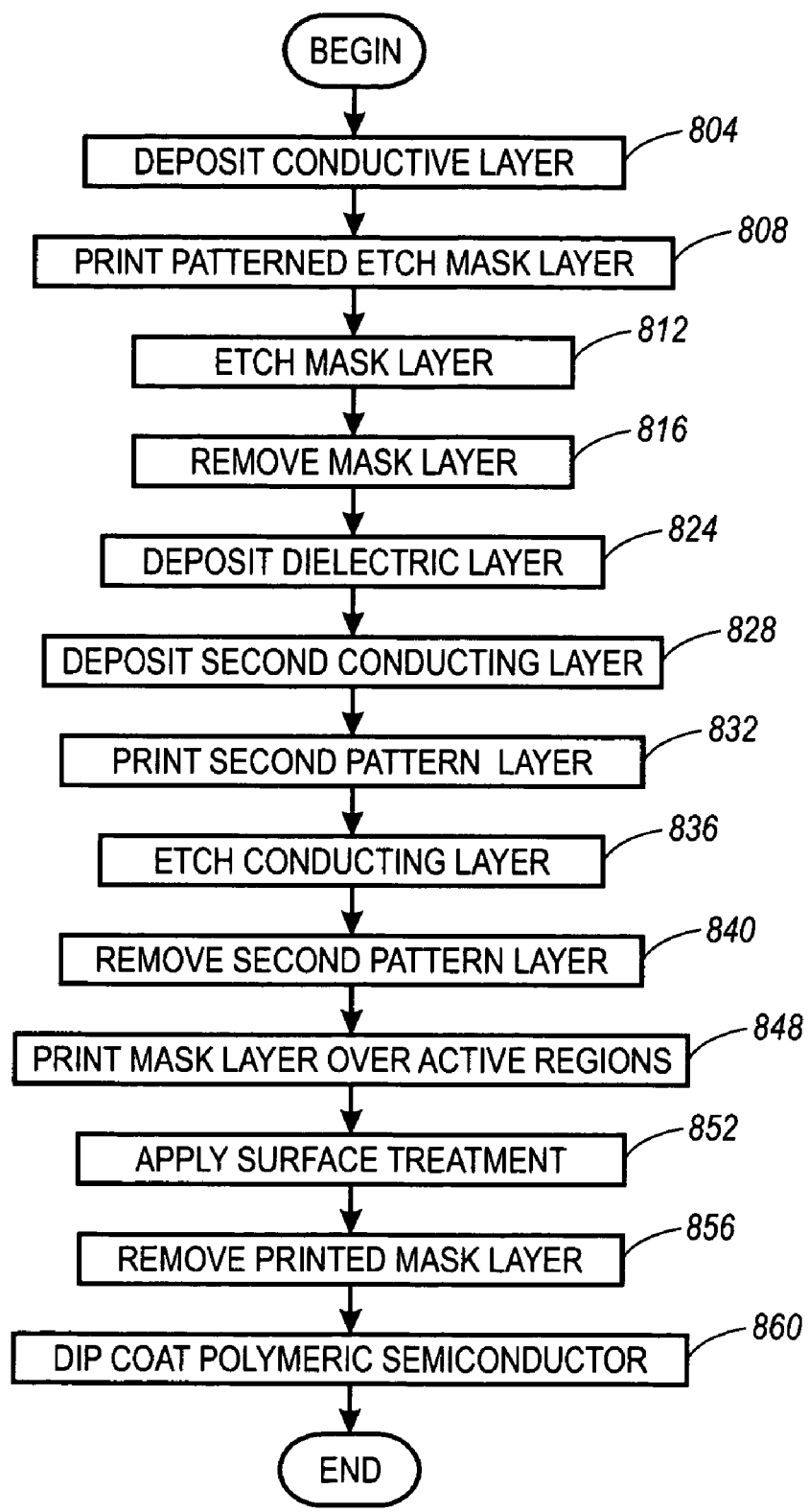
FIG. 8 is a flowchart that describes one method of forming a polymeric semiconductor thin film transistor.
Figure 9:
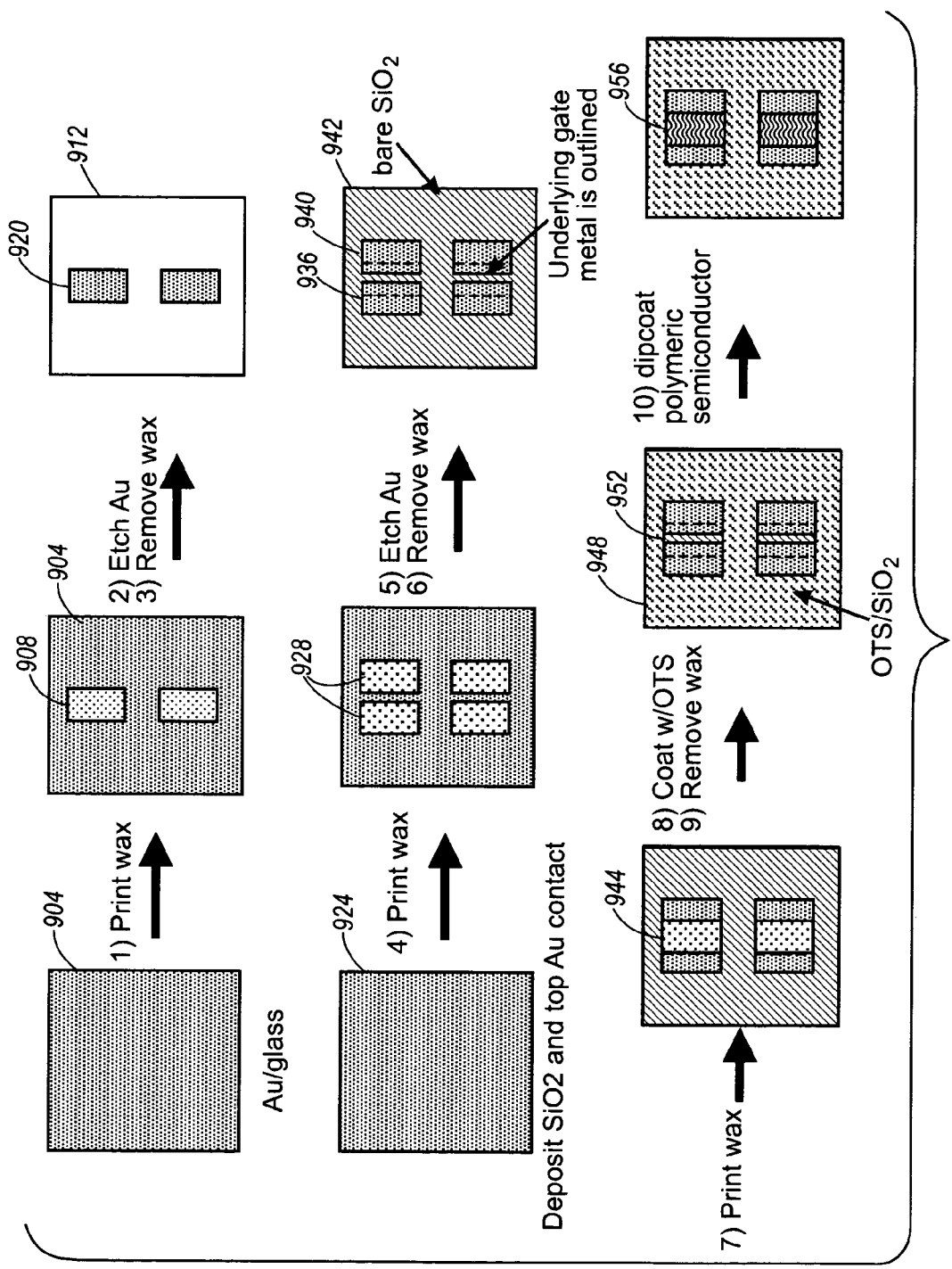
FIG. 9 is a top view of a semiconductor substrate at various stages of forming a dip-coated polymeric semiconductor.

Another specific application of using the described patterning and surface treatment procedure is to form a polymeric-semiconductor thin-film transistor. FIG. 8 is a flow chart showing the operations used to form such a transistor. FIG. 9 shows top views of the polymeric-semiconductor thin-film transistor (TFT) at various stages in fabrication where the drain, source and gate of the TFT are formed. In block 804, a conductive layer 904 such as gold or palladium is deposited onto a substrate, such as silicon, glass, quartz, or a polymeric-based flexible material. A patterned etch mask. Layer 908 is printed over the conductive layer to define bottom gate electrode features in block 808. The masked surface is etched in block 812 using either a wet or dry etchant to remove conductive layers exposed by the printed mask leaving exposed substrate 912. After etching, the printed etch mask is removed in block 816 revealing conducting gate 920.

A dielectric layer, such as silicon nitride or silicon dioxide (typical thickness between 200-300 nm) is deposited over the entire substrate surface in block 824. Alternative dielectric materials include spin-on glass, polyamide, or benzocyclobutene. Source and drain contacts are formed by depositing a second conductive layer 924 of FIG. 9, typically gold or palladium, over the dielectric layer in block 828. The typical thickness of the source/drain contact metal is between 100-200 nm. To define the source/drain contact features, a second pattern layer 928 is printed over the second conductive source/drain contact layer in block 832. In block 836, this second conductive layer is etched to define the source/drain contact features 936, 940 as shown in structure 942 of FIG. 9. In block 840, the second pattern layer is removed leaving defined source/drain contact features 936, 940.

In block 848, a mask layer 944 is printed to cover the active regions of the polymeric TFT to be formed. The substrate is coated with a surface treatment layer 948 of FIG. 9 such as OTS or a self-assembled monolayer in block 852. The printed mask layer removed in block 856. Areas that were subject to the surface treatment layer 948 are hydrophobic while previously masked surfaces 952 that were not subject to the surface treatment are hydrophilic. A Polymeric semiconductor 956 that serves as the active region is deposited onto the surface treated substrate. One method of depositing the polymeric semiconductor onto the surface treated substrate is by dip coating the entire substrate as described in block 860. The polymeric semiconductor 956 that serves as the active material adheres to the hydrophilic regions and dewets off hydrophobic areas. The final structure that results is a polymeric semiconductor thin-film transistor.

The described methods can use wax as the patterned layer and etch mask material. Registration of overlying layers is accomplished by alignment marks on the processed surface. Alignment may be performed visually using a camera and substrate-stage controller. In addition, the application of the polymeric semiconductor or any liquid-based material can be applied by various methods such as jet printing, spin coating, "doctor blading", or other methods of large-area coating known to those of skill in the art.

It should be understood that the foregoing description is intended to be illustrative of the invention. Variations and modification of the descriptions provided herein will present themselves to those skilled in the art. For example, the description has identified examples of phase-change materials, as well as different methods of causing a droplet to be ejected from a fluid reservoir. Examples of devices fabricated, such as a thin-film transistor, have been described. However, other methods, other phase-change materials may also be used. Other devices may also be fabricated using the methods described herein. Accordingly, the present description should not be read as limiting the scope of the invention except as described in the claims that follow.

What is claimed is:

1. A method of forming a semiconductor thin film transistor comprising the operations of:

depositing a source/drain layer including metal;

printing a mask using droplets over the source/drain layer, the mask to cover a first region and a second region, a spacing separates the first region and the second region, the width of the space less than the width of a droplet;

etching around the mask; and, removing the mask such that the first region results in a thin film transistor source and the second region results in a thin film transistor drain.

2. The method of claim 1 wherein the width of the spacing is less than 40 micrometers.

3. The method of claim 1 further comprising:

forming a gate over which the source/drain layer including metal is deposited.

4. The method of claim 3 wherein the operation of forming a gate comprises:

depositing a gate metal layer;

depositing a gate mask over the gate metal layer; and, etching the gate metal layer to form a thin film transistor gate, the gate layer and the source/drain layer aligned such that the gate is under the spacing between the source and drain.

5. The method of claim 3 further comprising the operation of:

depositing a dielectric layer prior to forming the gate such that the dielectric layer separates the gate and the source/drain layer.

6. The method of claim 1 further comprising the operation of:

printing a second mask to cover a thin film transistor active region to be formed;

coating regions not covered by the second mask with a surface treatment to make regions not covered by the second mask hydrophobic;

removing the second mask; and, applying a polymeric semiconductor that adheres to areas that are not hydrophobic, the polymeric semiconductor to form the thin film transistor active region.

7. The method of claim 6 wherein the applying of the polymeric semiconductor is done by dip coating.

8. The method of claim 6 wherein the surface treatment is a self assembled monolayer.

9. The method of claim 6 wherein the active region is wider than the space between the source and the drain.

10. The method of claim 9 wherein the operation of forming a gate comprises:

depositing a gate metal layer;

depositing a gate mask over the gate metal layer; and, etching the gate metal layer to form a thin film transistor gate, the gate metal layer and the source/drain layer aligned such that the gate is under the spacing between the source and drain.

11. The method of claim 10 further comprising:

depositing a dielectric layer between the gate metal layer and the source/drain layer.

12. The method of claim 6 further comprising the operations of:

forming a gate over which the source/drain layer including metal is deposited.

13. The method of claim 1 wherein the printing of the mask is done by jet printing drops, each drop having a diameter such that the separation between the source and the drain is less than the diameter of an average drop.

14. A method of forming a semiconductor thin film transistor comprising the operations of:

printing by depositing drops, a first protective layer in a first pattern over a substrate;

etching the regions of the substrate unprotected by the protective layer;

removing the first protective layer;

depositing a second protective layer in a second pattern over the substrate;

coating the substrate with a coating layer;

removing the second protective layer; and, depositing a polymeric semiconductor to form a thin film transistor.

15. The method of claim 14 wherein the coating makes regions not protected by the second protective layer hydrophobic.

16. The method of claim 14 wherein the depositing of the polymeric semiconductor is done by dip coating the substrate.

17. The method of claim 14 wherein the depositing of the polymeric semiconductor is done by printing.

18. The method of claim 14 wherein the first protective layer defines a source and a drain, the source and drain separated by a space, the width of the space less than a diameter of the drops.

19. The method of claim 18 wherein the width of the space is less than 40 microns.

20. The method of claim 19 wherein the second protective layer defines an active region of the thin film transistor.

21. A method of forming a gate of a thin film transistor comprising the operations of:

depositing a layer including a metal;

depositing a mask pattern by depositing drops over the layer including metal, the mask pattern including an opening less than the diameter of a drop in the drops;

depositing a surface treatment in the opening;

removing the mask pattern;

etching the layer including the metal such that regions not protected by the surface treatment are removed; and, removing the surface treatment such that a thin film transistor gate remains.

22. The method of claim 21 wherein the surface treatment is a self assembled monolayer.

* * * * *